United States Patent
Bronner et al.

[19]

[11] Patent Number: 6,087,225
[45] Date of Patent: Jul. 11, 2000

[54] METHOD FOR DUAL GATE OXIDE DUAL WORKFUNCTION CMOS

[75] Inventors: Gary Bela Bronner, Stormville, N.Y.; Badih El-Kareh, Austin, Tex.; Stanley Everett Schuster, Granite Springs, N.Y.

[73] Assignee: International Business Machines Corporation, Armonk, N.Y.

[21] Appl. No.: 09/018,939

[22] Filed: Feb. 5, 1998

[51] Int. Cl.$^7$ ............................................. H01L 21/8234
[52] U.S. Cl. ........................... 438/275; 438/279; 257/351
[58] Field of Search ................................... 438/217, 258, 438/275, 239, 279, 200

[56] References Cited

U.S. PATENT DOCUMENTS

| | | | |
|---|---|---|---|
| 5,083,178 | 1/1992 | Otsu | 257/208 |
| 5,480,828 | 1/1996 | Hsu et al. | 438/275 |
| 5,607,868 | 3/1997 | Chida et al. | 438/258 |
| 5,668,035 | 9/1997 | Fang et al. | 438/239 |
| 5,712,201 | 1/1998 | Lee et al. | 438/239 |
| 5,953,599 | 9/1999 | El-Diwany | 438/275 |
| 5,960,289 | 9/1999 | Tsui et al. | 438/275 |

FOREIGN PATENT DOCUMENTS

| | | |
|---|---|---|
| 0206929 | 6/1986 | European Pat. Off. . |
| 0 206 929 A1 | 12/1986 | European Pat. Off. . |
| 0474068 | 8/1991 | European Pat. Off. . |
| 0751560 | 6/1995 | European Pat. Off. . |
| 4-260364 | 9/1992 | Japan . |
| 4-276655 | 10/1992 | Japan . |
| 8-204025 | 8/1996 | Japan . |
| 8-330436 | 12/1996 | Japan . |
| 9-148449 | 6/1997 | Japan . |

OTHER PUBLICATIONS

Copy of European Search Report dated May 19, 1999 performed by C. Wirner for application EP99300234.

*Primary Examiner*—Wael Fahmy
*Assistant Examiner*—William David Coleman
*Attorney, Agent, or Firm*—Whitham, Curtis & Whitham; Wayne L. Ellenbogen, Esq.

[57] ABSTRACT

A method of forming integrated circuit chips including two dissimilar type NFETs and/or two dissimilar type PFETs on the same chip, such as both thick and thin gate oxide FETs. A DRAM array may be constructed of the thick oxide FETs and logic circuits may be constructed of the thin oxide FETs on the same chip. First, a gate stack including a first, thick gate SiO$_2$ layer is formed on a wafer. The stack includes a doped polysilicon layer on the gate oxide layer, a silicide layer on the polysilicon layer and a nitride layer on the silicide layer. Part of the stack is selectively removed to re-expose the wafer where logic circuits are to be formed. A thinner gate oxide layer is formed on the re-exposed wafer. Next, gates are formed on the thinner gate oxide layer and thin oxide NFETs and PFETs are formed at the gates. After selectively siliciding thin oxide device regions, gates are etched from the stack in the thick oxide device regions. Finally, source and drain regions are implanted and diffused for the thick gate oxide devices.

10 Claims, 9 Drawing Sheets

METHOD FOR DUAL GATE OXIDE DUAL WORKFUNCTION CMOS

BACKGROUND OF THE INVENTION

1. Field of the Invention

The present invention generally relates to semiconductor chip manufacturing processes and more particularly to dual gate oxide, dual work function field effect transistor manufacturing processes that may be adapted for manufacturing merged logic and dynamic random access memory chips.

2. Background Description

Dynamic random access memory (DRAMs) and logic designs have different design points and requirements. Logic design is focused, typically, on speed at the cost of increased power. Consequently, high device leakage current can be tolerated. By contrast, the primary focus in DRAM design is minimizing leakage currents that would otherwise reduce memory cell data retention time.

State of the art IC chips must be able to allow wider ranges of on-chip voltages, while increasing circuit performance and design flexibility.

For example in DRAM designs, it is necessary to boost the wordline voltage above the circuit power supply voltage to increase the charge stored on storage nodes and to improve resulting signals read therefrom.

However, boosting wordline voltage increases the electric field across the gate dielectric of transfer devices tied to the wordline. Therefore, to satisfy gate dielectric reliability requirements, the transfer gate's dielectric is thickened. For a typical DRAM chip with a uniform gate oxide thickness, the thickened gate oxide degrades performance in peripheral circuits and input/output (I/O) circuits. While this degradation may cause an acceptable impact in DRAM performance, when a DRAM is merged with high performance logic, the logic becomes prohibitively slow. There is, therefore, some reluctance in merging high performance logic with DRAM cells on a single chip, because of the inherent increase in process complexity.

Another problem is transient voltage spikes on I/O device gate oxide from I/O voltage overshoots and undershoots. These voltage spikes require special decoupling to reduce the spikes' magnitude. These decoupling structures occupy additional chip area and add to design complexity. So, techniques have been suggested, known as dual gate processes, to provide two different gate oxide thicknesses on the same chip in order to both improve logic performance and increase circuit design flexibility.

In the simplest such dual gate oxide process, an initial gate oxide is grown. Then, the gate oxide is photolithographically patterned to protect thick gate oxide region and expose thin oxide gate regions. Then, the oxide is etched from the exposed regions. The mask is removed and, oxide is grown in the thin oxide regions and simultaneously thickened in the initially protected gate oxide regions.

A major drawback of this method is that coating the first gate oxide layer with photoresist and then stripping the photoresist may reduce chip yield and degrade reliability. "Simultaneous Growth of Different Thickness Gate Oxides in Silicon CMOS Processing" by Doyle, B., Saleimani, H. R. and Philiposian A. in *IEEE Electron Device Letters* Vol. 16, No.7, pp. 301-1 (1995), teach another approach to growing dual gate oxides on a single chip. Doyle et al. teach selectively implanting nitrogen into surface of the substrate in thin gate oxide regions. The presence of nitrogen retards oxide growth in thin oxide regions. Then, when oxide is grown, simultaneously in both regions, oxide grows slower in thin oxide regions. As a result, thick gate oxide grows everywhere except in regions implanted with nitrogen. While the Doyle et al. technique has been shown to be technically feasible, repeatable results are yet to be shown.

Still another problem complicating a merged DRAM/logic process is the need for forming dual work function gate conductors, i.e., P-type in P-type field effect transistors (PFETs) and N-type in N-type field effect transistors (NFETs), without disturbing the polysilicon-tungsten-nitride gate stack in the DRAM cells. This is especially difficult without increasing overall process complexity. It is equally difficult to avoid the reduced DRAM cell retention time and metal contamination arising from selectively forming silicides only on logic circuits as may be desired.

Thus, there is a need for a reliable merged DRAM/logic process with selectively formed dual gate oxide thicknesses.

SUMMARY OF THE INVENTION

It is therefore an object of the present invention to merge high-performance logic with DRAM on a single integrated circuit chip.

It is another object of the present invention to grow two different field effect transistor gate oxide thickness on a single chip.

It is yet another object of the present invention to increase junction formation flexibility on integrated circuit chips.

It is yet another object of the present invention to increase junction formation flexibility on merged DRAM/logic integrated circuit chips.

It is yet another object of the present invention to selectively reduce source/drain and gate resistance in integrated circuit chips.

It is yet another object of the present invention to selectively form dual work function gates in FETs on a dynamic random access integrated circuit chip.

The present invention is a method of forming integrated circuit chips including two dissimilar type NFETs and/or two dissimilar type PFETs on the same chip, such as both thick and thin gate oxide FETs. The method includes the steps of: selectively forming a gate stack including first thick gate dielectric layer on a semiconductor wafer, preferably $SiO_2$ on a silicon wafer; then, forming a thinner gate dielectric layer on the wafer; next, forming gates on the thinner dielectric layer; defining thick oxide gate from the stack; forming source and drain regions for the thin gate oxide devices and doping the gate; and, finally, forming source and drain regions for the thick gate oxide devices and doping the gate. Preferably, the stack includes a polysilicon layer on the gate oxide layer, a silicide layer on the polysilicon layer and a nitride layer on the silicide layer.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
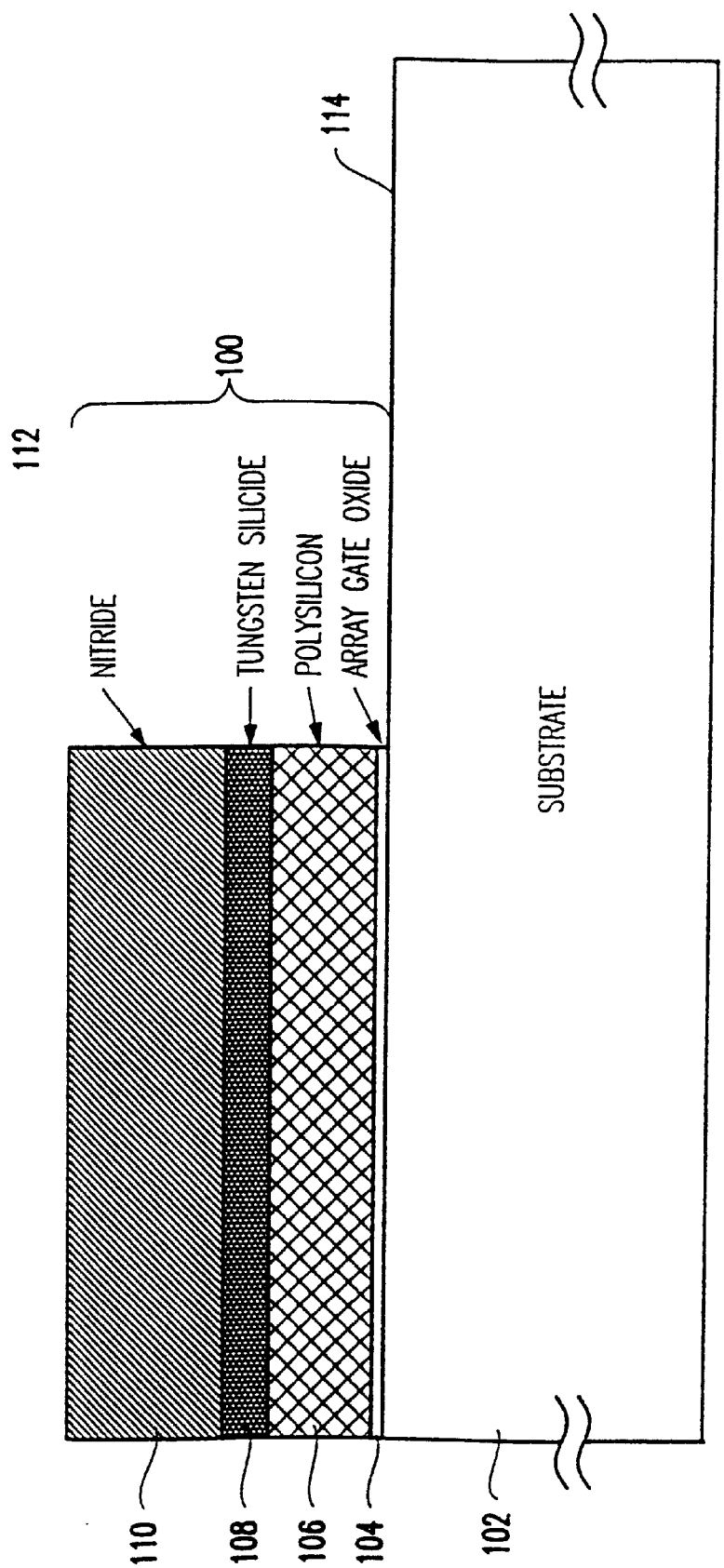
FIG. 1 shows a thick oxide gate stack formed according to the preferred embodiment of the present invention.

Referring now to the drawings, and more particularly to FIG. 1, which shows a first gate stack 100 formed according to the preferred embodiment of the present invention. The preferred embodiment of the present invention is a method of forming integrated circuit (IC) chips with multiple device types normally found on separate IC chips.

For example, a preferred IC device may include dynamic random access memory (DRAM) cells formed with DRAM specific process features and a high performance microprocessor formed for according to a logic process. The two processes are sufficiently decoupled to allow inclusion in either features specifically directed to the needs of the particular type device being formed. Thus, IC chips formed according to the preferred embodiment are formed using, effectively, two processes on the same chip.

As described herein for illustration, the first type devices, for DRAM, are formed from the first gate stack 100 in what is referred to herein as thick oxide areas. The second type devices, for logic, are formed from the second type devices in what is referred to herein as thin oxide areas. Further, these thick and thick areas may be isolated in specific chip regions, e.g. logic and RAM regions or, intermixed, selectively, to selectively increase voltage handling capabilities, such as in chip I/Os or, to selectively enhance gate capacitance.

Thus, the first type, thick oxide stack 100 is formed on a silicon substrate 102 after forming shallow trench isolation (STI) regions (not shown in FIG. 1). A first, thick gate dielectric or gate oxide layer 104, preferably 8.2 nanometers (nm), is formed on the substrate 102. A doped polysilicon layer 106, preferably n-type polysilicon between 50–100 nm thick, is formed on the dielectric layer 104. A tungsten silicide layer 108, preferably 50 nm thick, is formed on polysilicon layer 106.

Finally, capping layer 110 is formed on the stack. The preferred capping layer 110 is a 100–200 nm thick silicon nitride layer, and most preferably 200 nm. A person skilled in the art would understand how to alter the above stack materials and layer thicknesses may be altered as desired for a particular application without departing from the spirit or scope of the invention.

Having formed the stack 100, it is patterned and selectively removed to re-expose the substrate in thin oxide areas 112. Preferably, the stack 100 is patterned using a typical photolithographic masking step. Selected stack portions are removed, preferably, using reactive ion etching (RIE). The stack 100 is sequentially etched to remove portions of the top nitride layer 110, the tungsten silicide layer 108, and the polysilicon layer 106, stopping at the gate oxide layer 104. Then, the exposed gate oxide layer 104 is etched away to re-expose the substrate surface 114.

Figure 2:
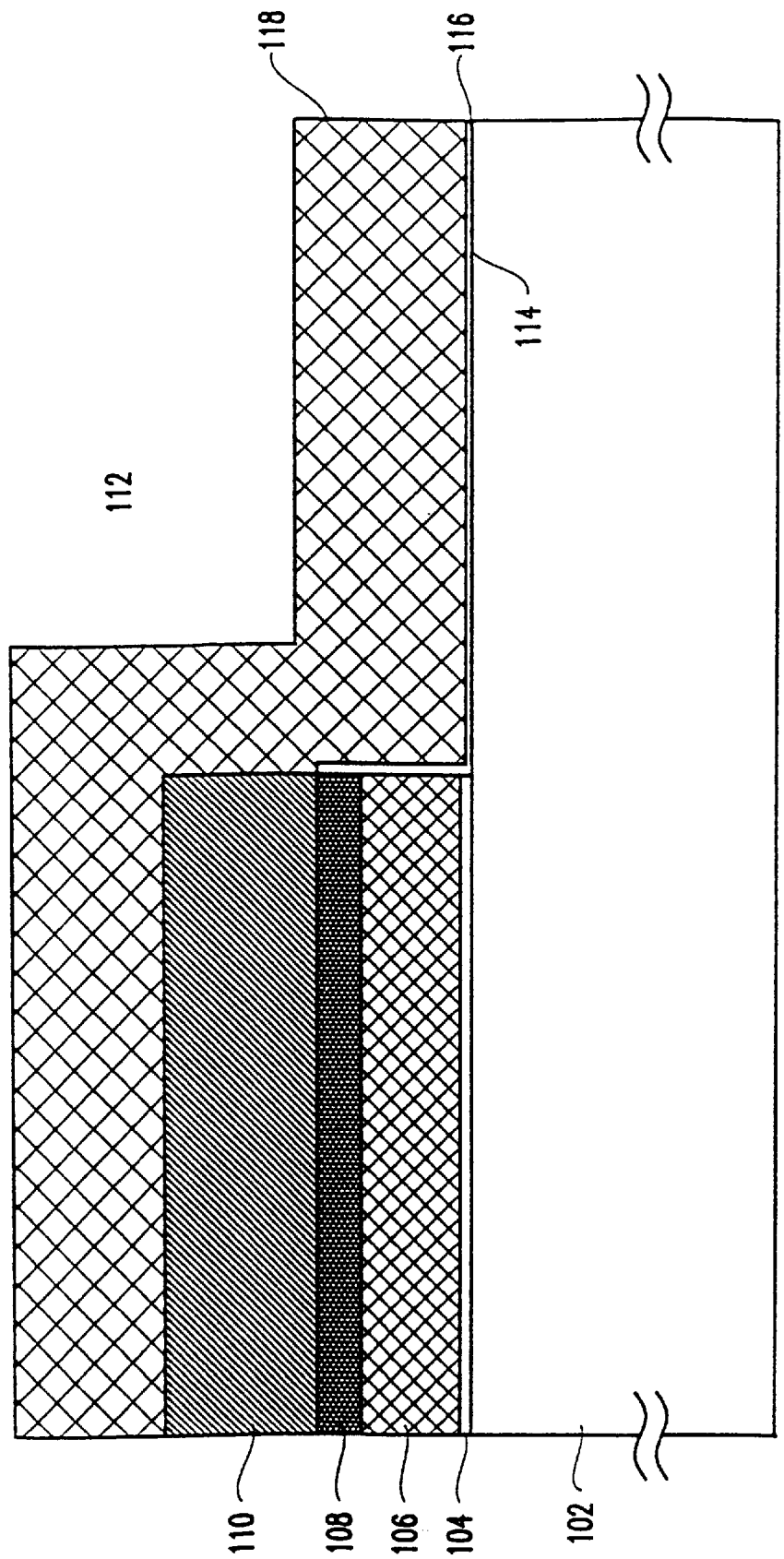
FIG. 2 shows a second polysilicon layer on the stack and over a thin gate oxide layer.

Having defined thin oxide areas 112, in FIG. 2 a thin gate oxide 116 is grown on exposed substrate surface 114. Oxide forms over the exposed sidewall of tungsten silicide layer 108 and polysilicon layer 106. An undoped polysilicon layer 118 is deposited on thin gate oxide 116. Preferably undoped polysilicon layer 118 is 100–200 nm thick.

Figure 3:
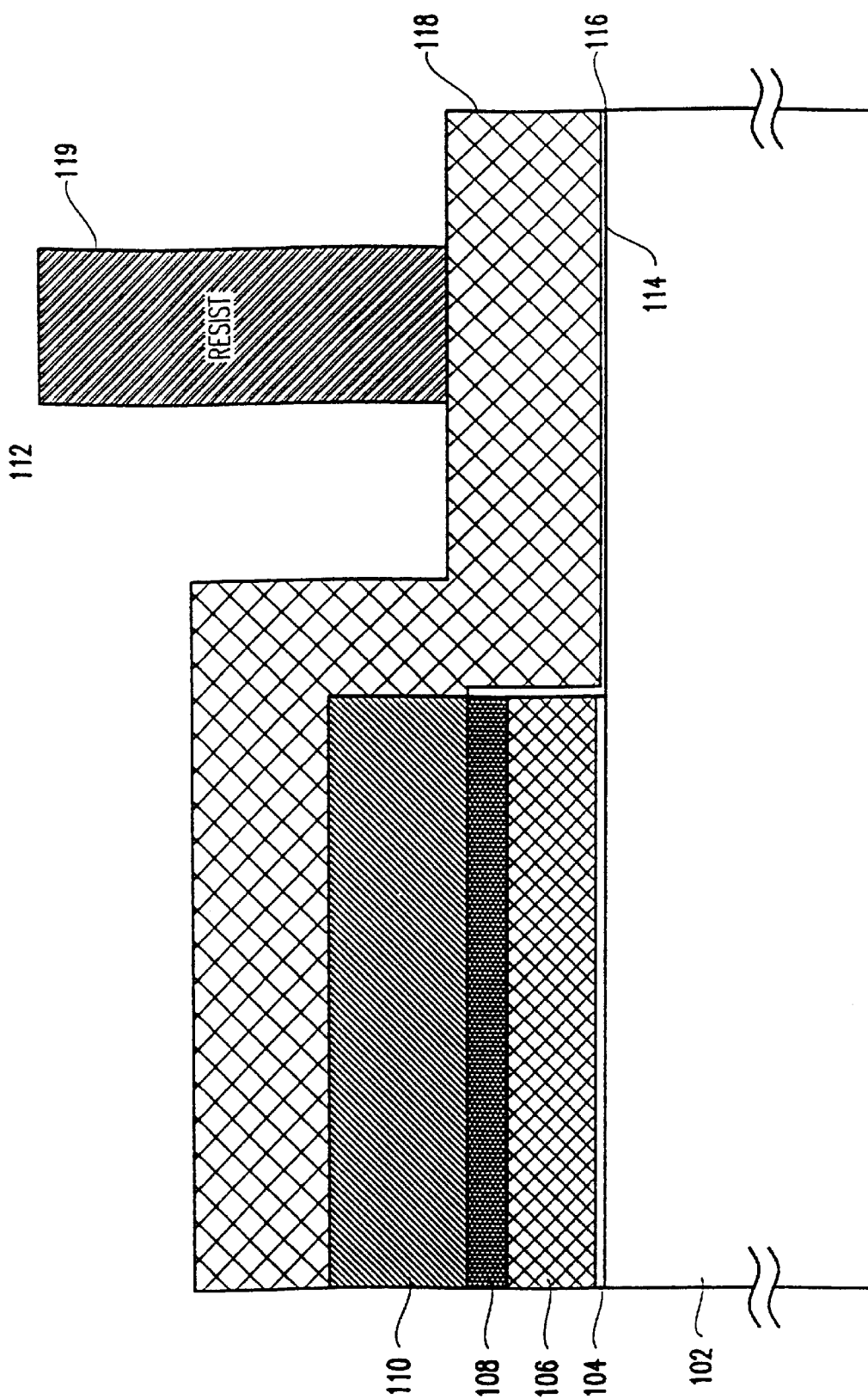
FIG. 3 shows resist defining thin oxide FETs.

Next, as shown in FIG. 3 undoped polysilicon layer 118 is photolithographically patterned in thin oxide areas 112. After forming the mask 119, the undoped polysilicon layer 118 is etched directionally, resulting in the gate 120 shown in FIG. 4.

Figure 4:
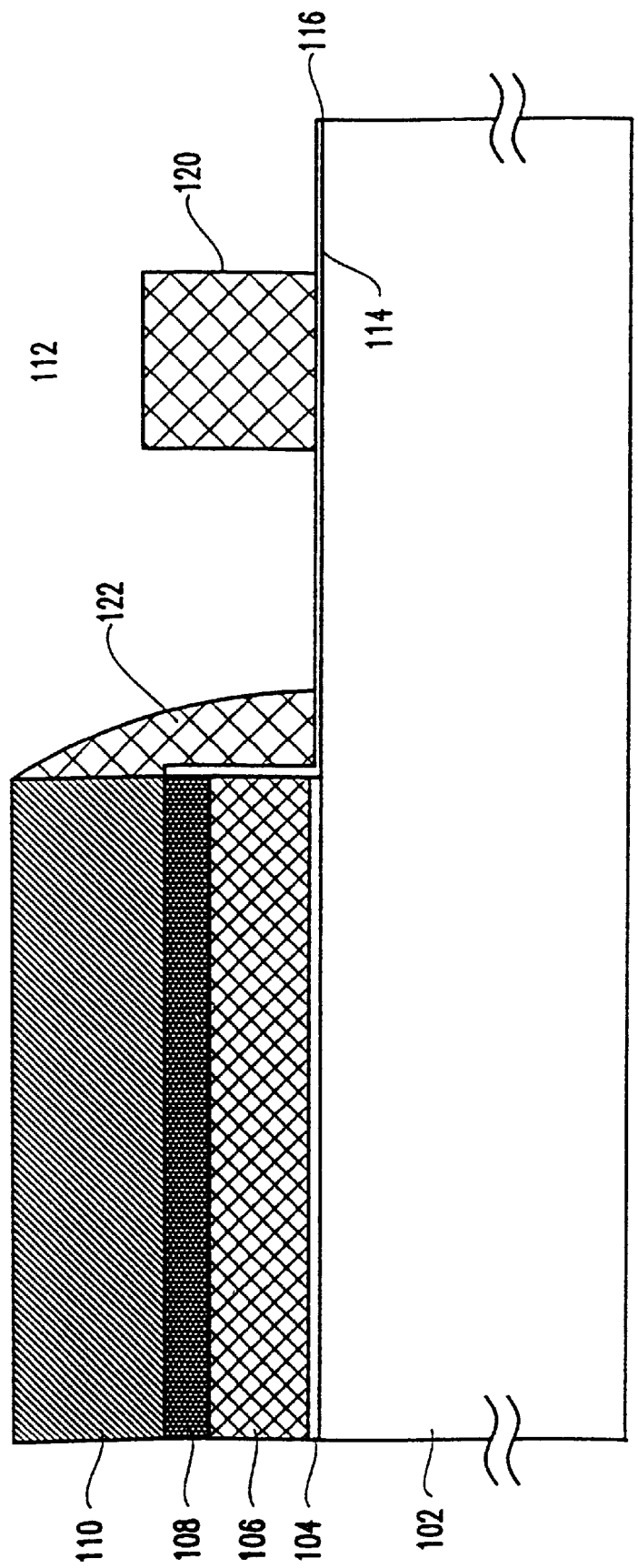
FIG. 4 shows a thin oxide FET gate spaced from the stack.

FIG. 4 also shows what is known as "stringer" 122 left at the periphery of the gate stack 100. It is possible to remove stringers 122 by overetching, e.g., isotropically. However, to avoid normally unwanted over etching, stringers 122 are removed in a subsequent step. Alternatively, the over etch needed to remove stringers 122 can be minimized by initially etching the gate stack 100 such that the remaining stack portions have a tapered sidewall profile.

Figure 5:
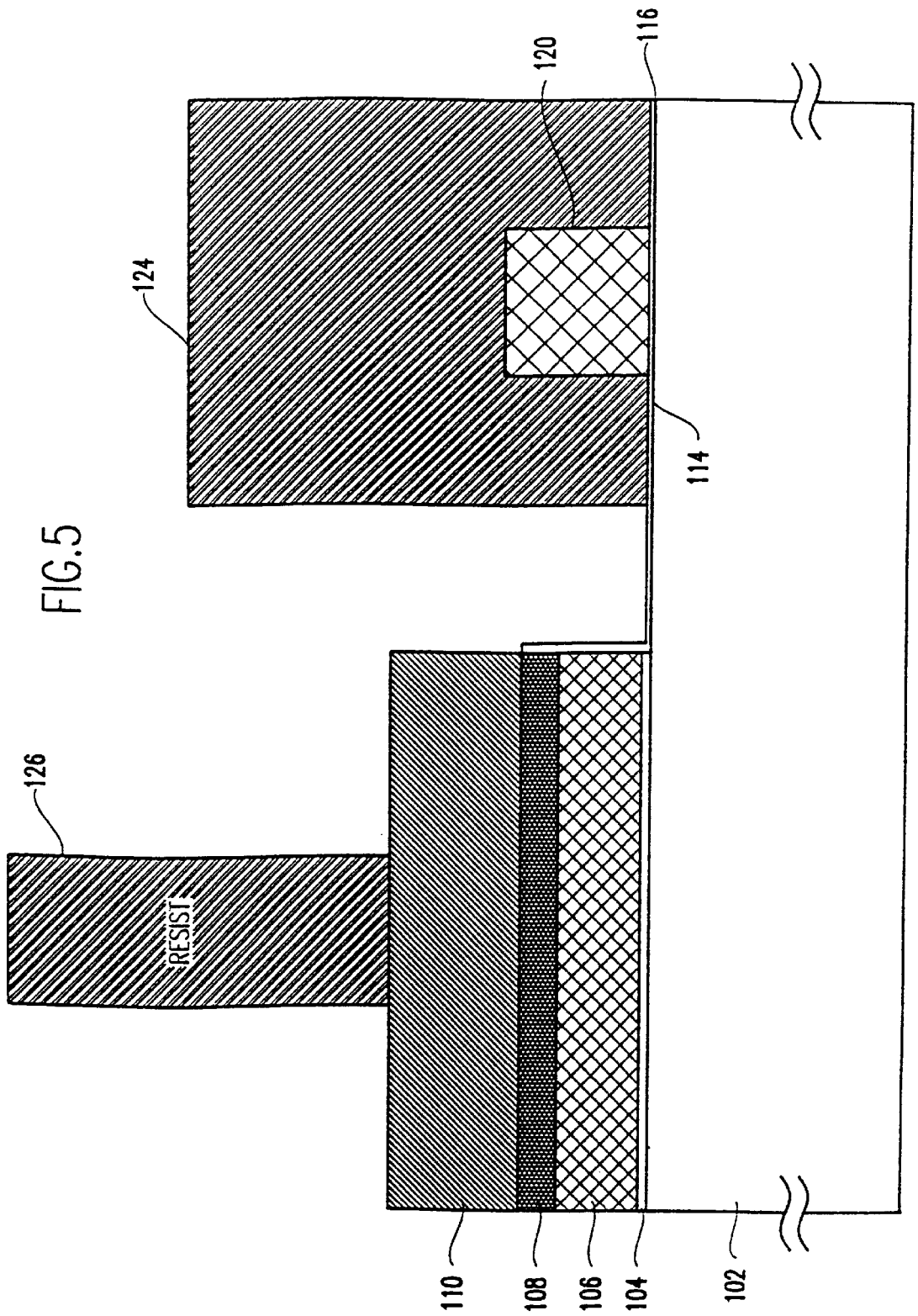
FIG. 5 shows a patterned thick oxide gate and thin oxide blocking mask.
Figure 6:
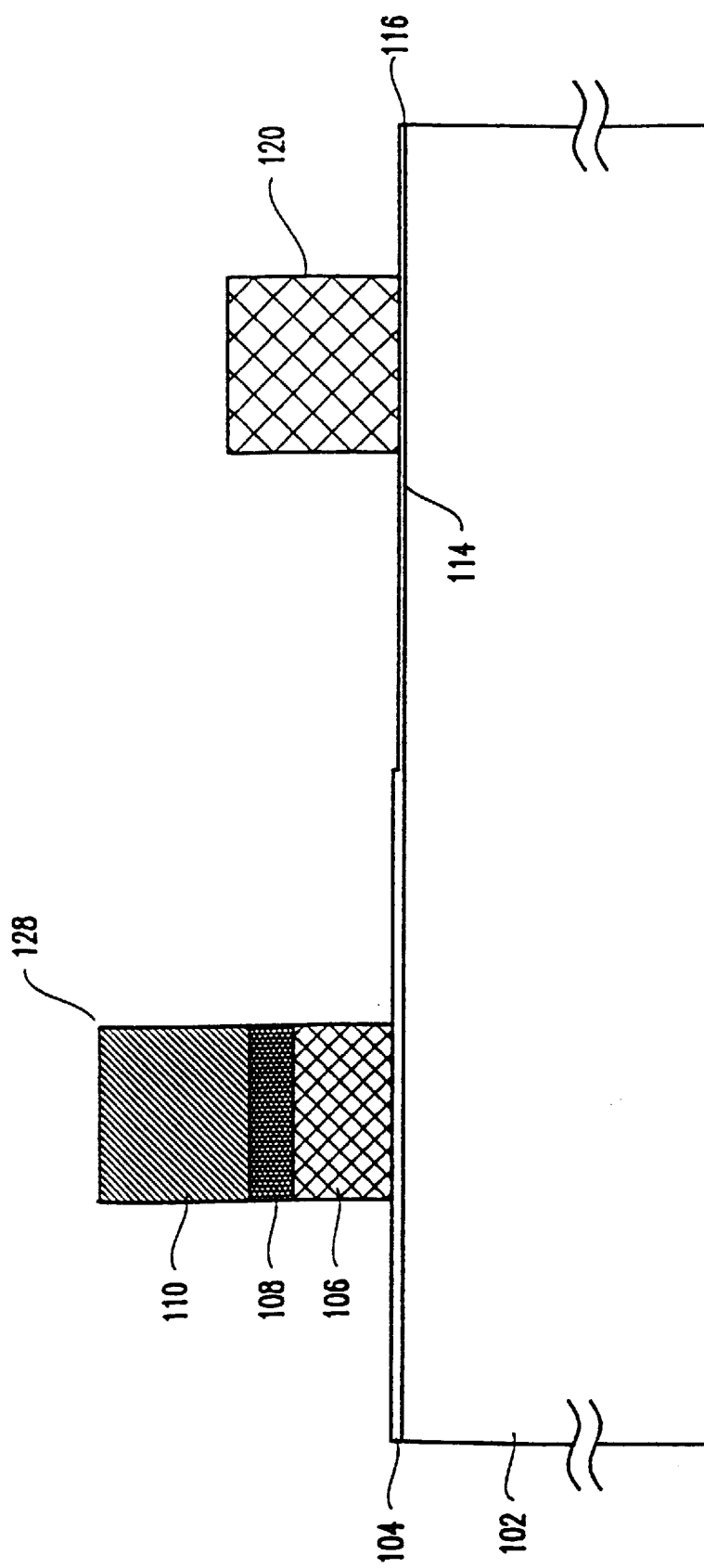
FIG. 6 shows thick oxide FET gates and thin oxide gates on the wafer.

Next, a masking layer is formed over the wafer and patterned as represented in FIG. 5. During a subsequent etch step, mask pattern shape 124 protects thin oxide gates 120 simultaneously with mask pattern shape 126 defining a thick oxide gate. After the etch step, in FIG. 6 thick oxide FET gates 128 etched from stack 100 remain on the surface alongside previously defined thin oxide FET gates 120.

Figure 7:
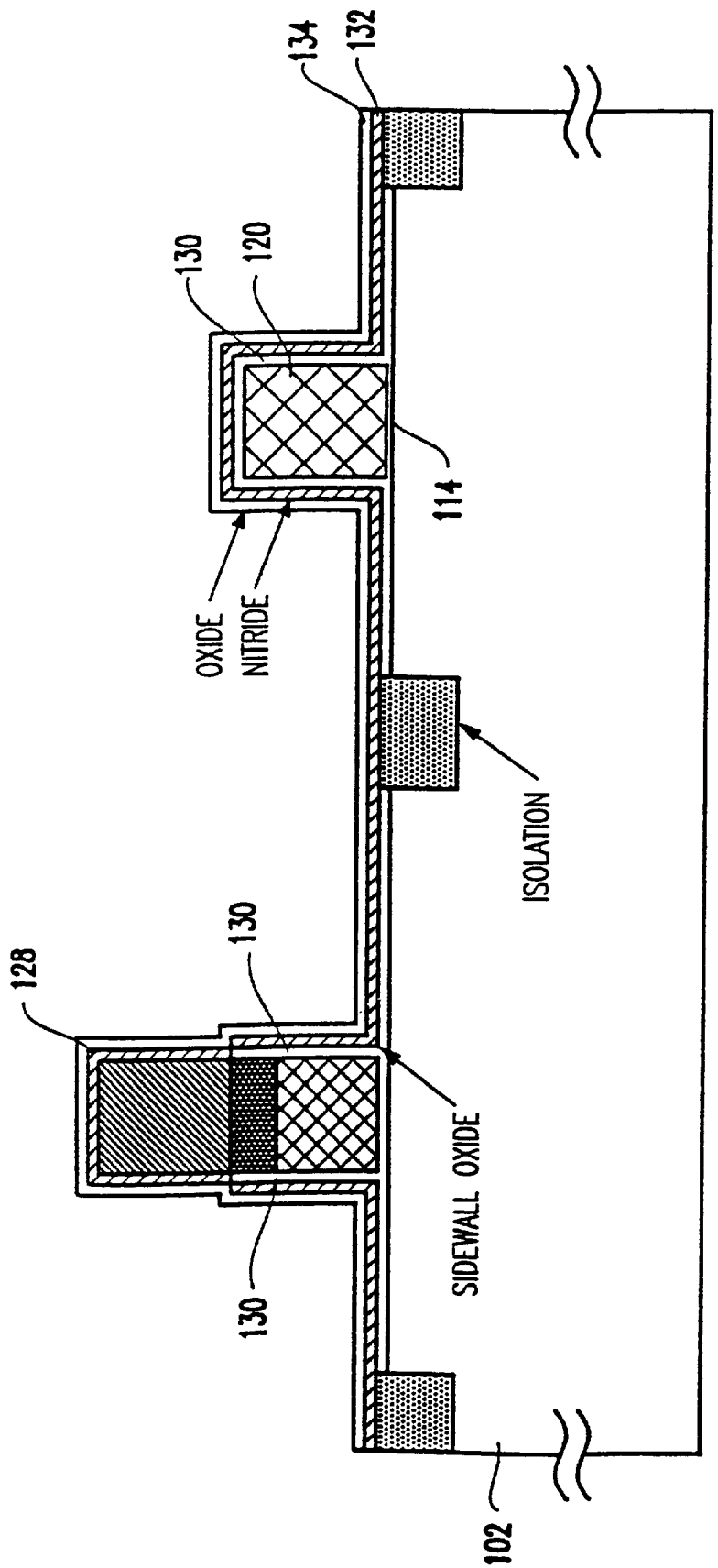
FIG. 7 shows a nitride and oxide layer on the structure of FIG. 6.

A thin sacrificial oxide layer 130 in FIG. 7 is formed over the substrate. The thin sacrificial oxide layer 130 forms on and along the sidewalls of polysilicon gate 120 and along the exposed sidewalls of layers 106 and 108 of gate 128. Dopant is implanted into source and drain extensions using appropriate mask and implant steps, i.e., N-type dopant for NFETs and P-type dopant for PFETs. Then, a nitride layer 132 is deposited covering sacrificial oxide layer 130 and on capping layer 110 on gate 128. An oxide layer 134 is deposited on the nitride layer 132.

Figure 8:
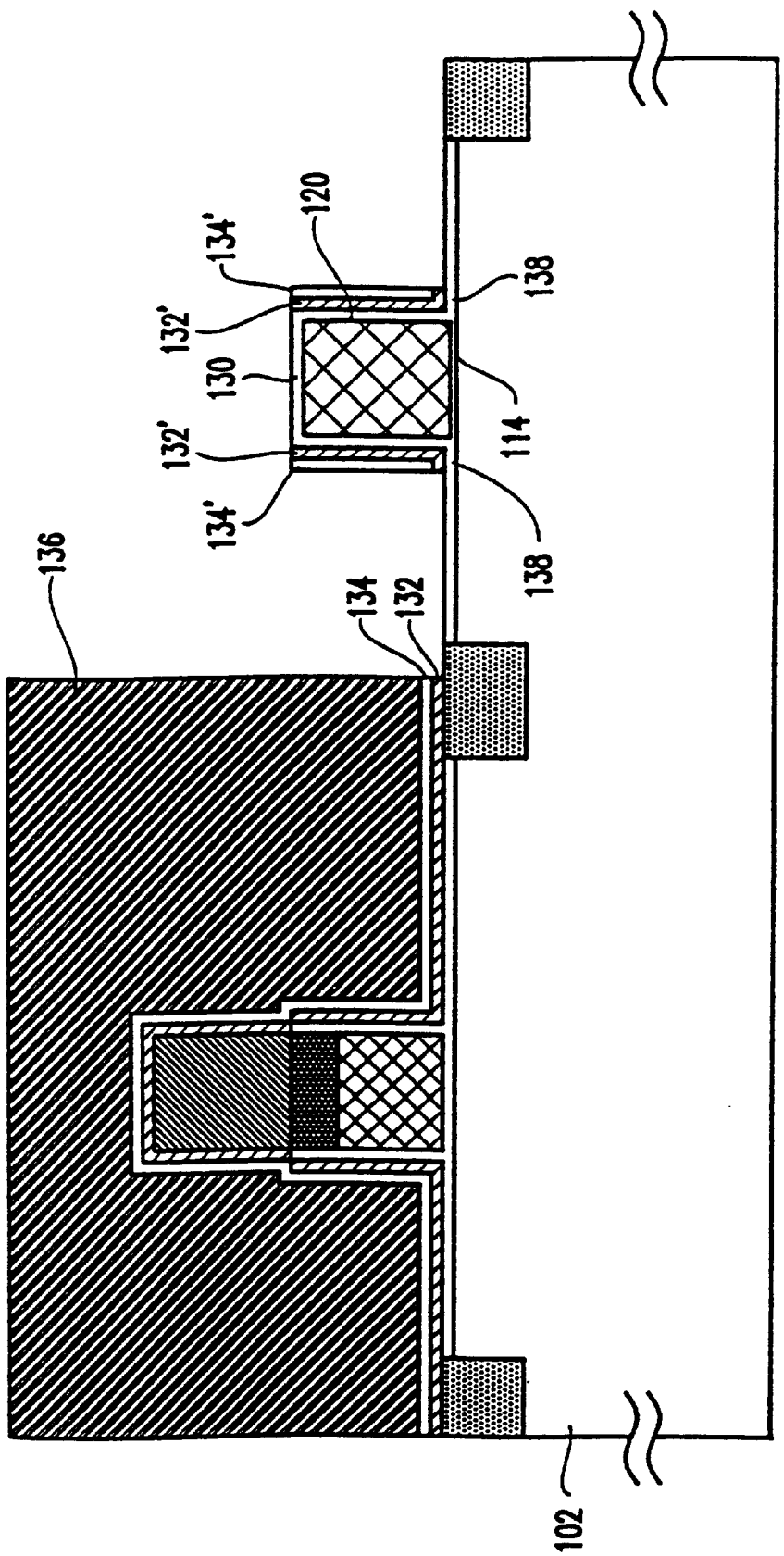
FIG. 8 shows a blocking mask over thick oxide areas during thin oxide device definition.

Next, as represented in FIG. 8, a blocking mask 136 is applied, which protects thick oxide devices as thin oxide devices are defined. Exposed portions of layers 132, 134 are selectively, directionally etched, sequentially, to leave spacers 138 along the sidewalls of gate 120. The etch is selective to nitride and oxide, causing the etch to stop at oxide 116. The spacers 138, which include a nitride portion 132' and oxide portion 134', insure in thin oxide FETs a safe distance between their channels and deeper portions of their source/drain junctions and surface silicides.

Figure 9:
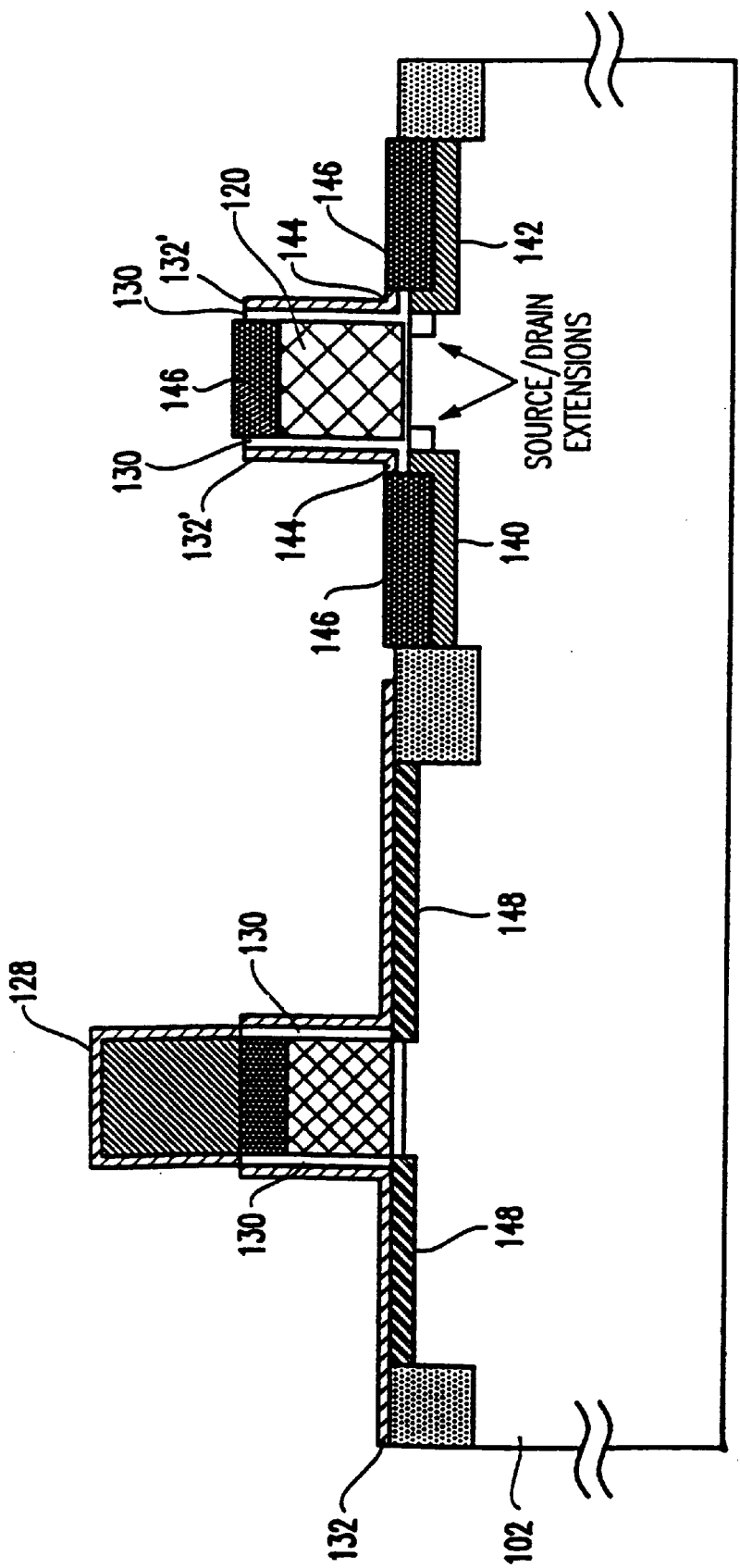
FIG. 9 shows thick and thin oxide FETs on the same wafer according to the preferred embodiment of the present invention.

After forming the spacers 138, deeper junctions are formed at the source/drain extensions by implanting additional dopant of the same type. Starting with N-type, dopant is implanted into the devices' source/drain regions 140, 142 in FIG. 9, simultaneously with doping polysilicon gates 120. Then, this etch and implant is repeated for the second type (P-type) FETs. These separate thin oxide device definition steps allow deep junction formation and dual work function gate formation in these thin oxide device regions independent of the other thicker oxide FETs.

After forming the thin oxide devices, the remaining exposed oxide 116 and spacer oxide 134' is removed using a dip etch, which exposes source/drain junctions 140, 142 and n-well contacts (not shown). Blocking mask 136 is removed by an appropriate strip. The remaining nitride spacer 132' has a small nitride tab 144 that spaces subsequently formed silicide at a safe distance from gate conductor 120 to prevent shorts.

Silicide 146 is formed simultaneously on source/drains 140, 142, and thin oxide (logic) polysilicon gates 120 both for PFETs and NFETs. N-well contacts (not shown) may be silicided at this point as well. Nitride layer 132 and remaining oxide film 132 prevent silicide formation on gates 128.

Finally, having thus formed two unique FET structures on the same chip, appropriate semiconductor processing steps are employed to complete formation of the IC chip. One important consideration in subsequent fill and heat cycles is that thermal cycles must be consistent with silicide stability requirements. Thus, a low-temperature BPSG fill using a high-density plasma fill technique is preferred for subsequent fill and then, reflow at $\leq 750°$ C. over the completed structure 100 of FIG. 9.

Alternatively, oxide spacers 134 described above may be formed from doped glass such as BPSG. Spacers thus formed are not removed as described above, but instead, become part of the subsequent fill, to simplify the overall process flow.

The resulting preferred embodiment IC chip is a chip wherein RAM and logic have been merged successfully without the normal penalties incurred in such a merger.

While the invention has been described in terms of a single preferred embodiment, those skilled in the art will recognize that the invention can be practiced with modification within the spirit and scope of the appended claims.

We claim:

1. A method of forming an integrated circuit chip, said method comprising the steps of:
    a) selectively forming a gate stack on a semiconductor wafer, said gate stack including a first dielectric layer, said first dielectric layer having a first thickness, said selectively forming the gate stack comprises the steps of:
        1) forming said first dielectric layer on said semiconductor wafer;
        2) forming a layered conductor on said first dielectric layer, said forming said layered conductor including:
            i) forming a layer of polysilicon on said first oxide layer;
            ii) forming a silicide layer on said polysilicon layer; and
        3) selectively removing said layered conductor to re-expose said first dielectric layer in selected areas; and
        4) removing exposed said first dielectric layer; and
    b) forming a second dielectric layer on said semiconductor wafer, said second dielectric layer having a second thickness different than said first thickness;
    c) forming at least one gate on said second dielectric layer;
    d) selectively removing portions of said gate stack to define at least one second gate;
    e) forming conduction regions adjacent said gate; and
    f) forming conduction regions adjacent said second gate.

2. The method of claim 1, wherein said at least one gate is a plurality of first gates and said at least one second gate is a plurality of second gates and wherein at least one of said plurality of gates is a first conduction type and at least one of said plurality of second gates is said first conduction type.

3. The method of claim 2, wherein at least one of said plurality of gates is a second conduction type and at least one of said plurality of second gates is said second conduction type.

4. The method of claim 2, wherein the first thickness is greater than the second thickness.

5. The method of claim 1 wherein the semiconductor wafer is silicon and the first dielectric layer and the second dielectric layer are oxide layers.

6. The method of claim 1 wherein the step (2) of forming the layered conductor further comprises the step of:
    iii) forming a nitride layer on said silicide layer.

7. The method of claim 1 wherein the step (3) of selectively removing said layered conductor comprises reactive ion etching said layered conductor to re-expose the thicker first oxide layer.

8. The method of claim 5 wherein the step (c) of forming the gates comprises the steps of:
    1) forming a polysilicon layer on said wafer; and
    2) selectively removing said polysilicon layer, remaining said polysilicon layer forming said first gates.

9. The method of claim 8 wherein the step e) of forming the gates' conduction regions comprises the steps of:
    1) depositing a layered dielectric on said wafer;
    2) selectively etching said layered dielectric to form sidewall spacers adjacent identified first conduction type gates;
    3) implanting a dopant of said first conduction type into said identified first gates and said identified gates' conduction regions;
    4) selectively etching said layered dielectric to form sidewall spacers adjacent identified second conduction type first gates; and
    5) implanting a dopant of said second conduction type into said identified first gates and said identified first gates' conduction regions.

10. The method of claim 9 wherein the step e) of forming the gates' conduction regions further comprises the step of:
    6) depositing silicide on said first gates and said first gates' conduction regions.

* * * * *